(12) United States Patent
Jansman et al.

(10) Patent No.: US 7,098,530 B2
(45) Date of Patent: Aug. 29, 2006

(54) PACKAGE FOR A HIGH-FREQUENCY ELECTRONIC DEVICE

(75) Inventors: Andreas Bernardus Maria Jansman, Oisterwijk (NL); Ronald Dekker, Eindhoven (NL); Godefridus Andrianus Maria Hurkx, Eindhoven (NL); Wibo Daniel Van Noort, Leuven (BE); Antonius Lucien Adrianus Maria Kemmeren, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/560,004

(22) PCT Filed: Jun. 8, 2004

(86) PCT No.: PCT/IB2004/050863

§ 371 (c)(1),
(2), (4) Date: Dec. 8, 2005

(87) PCT Pub. No.: WO2004/112134

PCT Pub. Date: Dec. 23, 2004

(65) Prior Publication Data

US 2006/0131736 A1    Jun. 22, 2006

(30) Foreign Application Priority Data

Jun. 12, 2003   (EP) .................................. 03101729

(51) Int. Cl.
*H01L 23/58* (2006.01)
(52) U.S. Cl. ........................ 257/684; 257/686; 257/728
(58) Field of Classification Search .................... None
See application file for complete search history.

(56) References Cited

U.S. PATENT DOCUMENTS

| 5,351,001 | A |   | 9/1994 | Kornrumpf et al. |       |
|-----------|---|---|--------|------------------|-------|
| 5,418,687 | A | * | 5/1995 | Chen ............ | 361/761 |
| 5,506,383 | A |   | 4/1996 | Chen             |       |
| 5,523,622 | A |   | 6/1996 | Harada et al.    |       |
| 5,998,859 | A |   | 12/1999 | Griswold et al. |       |
| 6,931,725 | B1 | * | 8/2005 | Sugaya et al. ... | 29/852 |

FOREIGN PATENT DOCUMENTS

| EP | 1 111 674 A2 | 6/2001 |
| EP | 1 298 728 A1 | 4/2003 |

* cited by examiner

*Primary Examiner*—Leonardo Andujar

(57) ABSTRACT

The electronic device comprises a substrate (1) with a cavity (6) in which an active device (8) is present. On the first side (2) of the substrate an interconnect structure (17) extends over the cavity and the substrate. On the second side (3) of the substrate to which the cavity extends, a heat sink (23) is available. The device is particularly suitable for use at high frequencies, for instance higher than 2 GHz and under conditions of high dissipation.

13 Claims, 13 Drawing Sheets

PACKAGE FOR A HIGH-FREQUENCY ELECTRONIC DEVICE

The invention relates to an electronic device comprising a substrate of a semiconductor material having a first and a second opposite side, which is provided with a first through-hole extending from the first to the second side, the substrate being provided with a first electrical element on its first side; an active device having a coupling surface provided with connection pads, which device is present in the first through-hole of the substrate with its coupling surface on the first side of the substrate; a thin film interconnect structure being provided on the first side of the substrate extending over the first through-hole and interconnecting the active device with the electrical element, the interconnect structure comprising connection faces corresponding to the connection pads; a heat sink is present on the second side of the substrate extending over the first through-hole and at least part of the substrate, and bond pads for connection to an external system.

Such an electronic device is known from U.S. Pat. No. 5,506,383. The active device herein is an integrated circuit, and the interconnect structure is designed so as to interconnect this integrated circuit to a further integrated circuit. The electronic device as a whole is herein a multi-chip module in which size reduction is achieved together with adequate heat dissipation. The substrate is provided with a multilayer interconnect structure, in which a ground plane and optionally a passive element are present. The through-hole extends herein through the substrate and through the interconnect structure.

The active device is processed so as to have a first layer and a second layer, wherein the first, bottom layer has a larger width. This allows a construction in which the active device hangs within the interconnect structure. On assembly, the active device is provided with a solder layer and is hung in the interconnect structure. The solder is herein reflowed to fill any gap between the interconnect structure and the device. Then, a conducting layer is deposited so as to provide the connection faces to the connection pads of the active device. Finally, the heat sink is laminated to the second side of the substrate.

It is a disadvantage of the known device, that the resulting size reduction is on the whole marginal in comparison to an electronic device in which a first integrated circuit and a second integrated circuit are stacked. Such stacked dies construction are known per se, for instance from U.S. Pat. No. 5,977,640. Additionally, the construction appears to result in high costs, in that the active device with its first and second layer is not standard.

It is therefore an object of the present invention to provide an electronic device of the kind mentioned in the opening paragraph, in which the technical benefits outweight the costs and size arguments with respect to a stacked-die solution.

This object is achieved in the invention in that the active device is made to process signals of a first frequency, and the first electrical element is part of a transformer for transforming the signals of the first frequency to a second, lower frequency and/or vice versa, so that in operation the bond pads transmit signals at the second frequency, and that the heat sink acts as a ground plane.

The device of the invention is very suitable for high frequencies, about 2 GHz and particularly about 10 GHz, in that it limits the high-frequency part of the signal processing and transmission to the electronic device. The advantage hereof is that the device will include all relevant high-frequency functions. It can then be used as a plug-and-play module. Moreover, the high-frequency part can be designed as a whole, without having any undesired and uncontrollable distortion of the high-frequency behavior.

Most preferably, wireless coupling means are present for transmission of signals at the first frequency to and/or from an external system. Such wireless coupling means are one or more antennas in particular. It is in combination herewith suitable that the active device acts as the amplifier of the signal transmitted by the antenna. Much more elements than only one active device may be present within the electronic device; as is known, the front-end of a mobile phone generally comprises bandpass filters, low-noise-amplifiers, power amplifiers in different stages, transceivers, impedance matching circuits, band switches, power control functions, oscillators and so on. As the electronic device of the invention is both an assembly platform, but also a thin-film network, the different elements can be defined in a desired technology and integrated suitably. It is not excluded herein, that some of the elements are assembled with flip-chip technologies. It is not necessary, that each active device is present in a separate cavity. Such active devices in a single cavity are for example different amplifier stages to be coupled to each other directly The electronic device is very suitable for the application at higher frequencies in view its very limited electrical losses. Electric losses occur as a consequence of an existing field between the interconnects including the connection to the active device, and the heatsink acting as a ground plane. With wirebonding between an active device and the substrate, major distortion in the electric field is given, leading to a parasitic inductance of about 500 pH. This is also due to the inherent inductance of the bond wires. In a stacked die-construction, this parasitic inductance is decreased tenfold to about 50 pH. However, there is still a substantial distortion of the electric field, as a result of the discontinuity at the areas where the connection faces are connected to the connection pads with solder or metal bumps. In the current solution, no such discontinuity is present, as the interconnect structure extends over the active device. The resulting parasitic inductance is decreased to less than 10 pH, while the parasitic capacitance is limited to less than 10 fF.

The integration of passive parts of a circuit with actives is known per se from U.S. Pat. No. 4,739,389. The active device is a semiconductor device having a body of a different semiconductor material from the semiconductor substrate. The electrical connection between the active and the passive elements is realized by wirebonding. As a result thereof, the device does not at all function the requirements for high frequencies, and as stated above, major signal distortion and attenuation results.

It is an advantage of the present invention, that it can be used for wide-band applications. A conventional solution to get rid of any parasitic inductance is the addition of a capacitor, of which the impedance is the complex inverse, such that at least the imaginary part of the impedance is leveled out. However, this leveling out only occurs for specific frequencies. In the current approach, the complete impedance is kept low, so that such leveling out is not necessary.

It is very much preferred that the transformer comprises multiplexers and demultiplexers. A transformation with this means appears to lead thereto, that the signal transformed to the second frequency can be a low-frequency signal. Such low-frequency signal are those signals provided from other units than the device within an audio/video transmission apparatus such as a video player, a computer, a mobile phone. The term 'low-frequency signal' is herein understood to be a signal that can be transmitted by bond wires, flex foil connections or whatever conventional coupling means. The only other supply to the device is then the voltage supply.

It is preferred that the wireless coupling means include a dipolar antenna. In that case it is possible that the signals are processed as differential signals, and that no conversion is done from differential to single-ended format. Herewith, a balun is not needed. For such a transmission of differential signals double lines are needed, both from and to the antenna. However, as the parasitic inductance is considerably reduced, this is not problematic. A suitable antenna for this object is a stepped impedance dipole. This stepped impedance dipole comprises for instance two lines leading to two dipole bars, the difference in line width between the connection lines and the dipole bars forming the step of the stepped impedance dipole. Such an antenna is small compared to the wavelength and it is symmetric with respect to ground.

In a further embodiment, also a matching circuit is present for matching the impedance of the wireless coupling means and that of the active device, particularly an amplifier. In combination with the dipolar antenna, such a matching circuit can be embodied as a parallel resonant impedance matching circuit, in which a first and a second transmission line are located substantially parallel to each other and mutually coupled by connection lines on one side and a capacitor on the other side. This capacitor is preferably embodied as a thin-film capacitor.

The device of the invention can be suitably used for hand held apparatus, in which a plurality of frequency bands need to be processed individually. Examples of the frequency bands include GSM, Bluetooth, Wireless LAN, 802.11, UMTS and LDMS. The device may further be used for specific high-frequency applications, such as needed for anticollision radars, which are intended for use in vehicles, and cars in particular.

It is preferable that the device of the invention comprises the signal transmission means for at least two frequency bands.

The device of the invention is further suitable for use in domestic and professional applications in which an optical signal needs to be converted into an electrical signal. Such applications are foreseen in respect of the use of optical fibers for communication. A photo-diode, and in case the communication is bi-directional, a laser diode will replace therein the antenna(s) used in case of wireless communication. A system to realize this is known from EP-A 733288. This is a system with independent photodiode and laser diode that are placed in-line. However, lateral pin diodes are very suitable as well for use as photodiodes. The device of the invention can be advantageously used therewith in view of the good broadband properties of the transmission lines in the interconnect structure.

The device of the invention is furthermore very suitable to comprise both optical coupling means and wireless coupling means. The optical coupling can then be used as a broadband connection to an external fiber network, and the wireless coupling can be used for communication to internal different functions, such as for instance amplifiers and loudspeakers, or light switches. Applications hereof are advanced television and also video telephones. Alternatively, the device is included in a hand-held apparatus, such as a mobile phone, or a portable computer. The wireless communication is then the main communication medium, but the optical communication can be used in addition thereto, for instance in that a fiber is temporally attached to the apparatus.

It is observed that the presence of wireless coupling means is not a necessity. An alternative is an CMA connector or a coax-calbe compatible connector. Such connectors cannot be connected to an active device directly, as the resolution of the active device is much too high. The active device herein is preferably provided with a substrate of a III–V material, such as InP, in which several semiconductor elements are defined. These semiconductor elements act as mixers, the design of which is known to the skilled person in the art. The substrate preferably comprises high-ohmic silicon, and filters and multiplexers can be added to the high-ohmic silicon as desired. The heatsink is necessary for this application, because the mixer produces much heat.

In an alternative application the active device is an array of light emitting diodes. Such an array must be addressed with desired circuitry. Furthermore, there is considerable heat dissipation during operation. The device of the invention is very well suitable to provide the needed addressing circuitry and the heat sink in a cost effective manner. Any active part needed for the addressing can be realized both in the substrate and in further active devices assembled in or on the substrate.

These and other aspects of the invention will be further elucidated with reference to the figs., in which.

DESCRIPTION OF PREFERRED EMBODIMENTS

Identical reference numbers indicate similar structural components.

FIGS. 1–8 show schematic cross-sectional views of different stages of the method according to the present invention.

Figure 1:
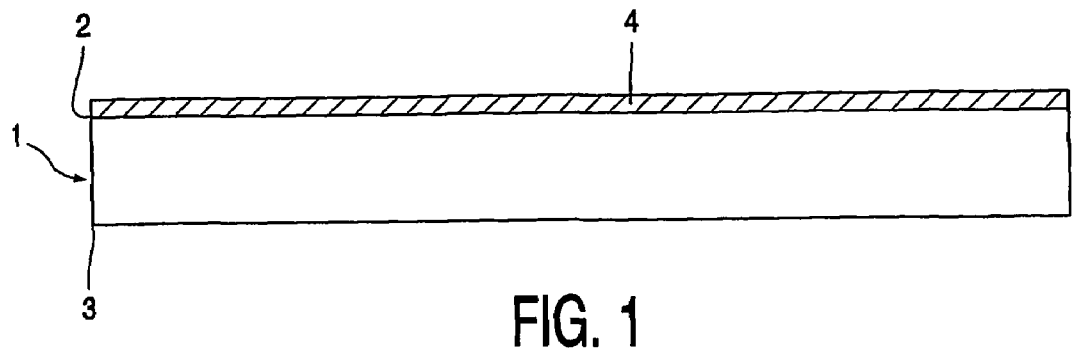
FIGS. 1–8 show schematic cross-sectional views of different stages of the first method according to the present invention.
Figure 2:
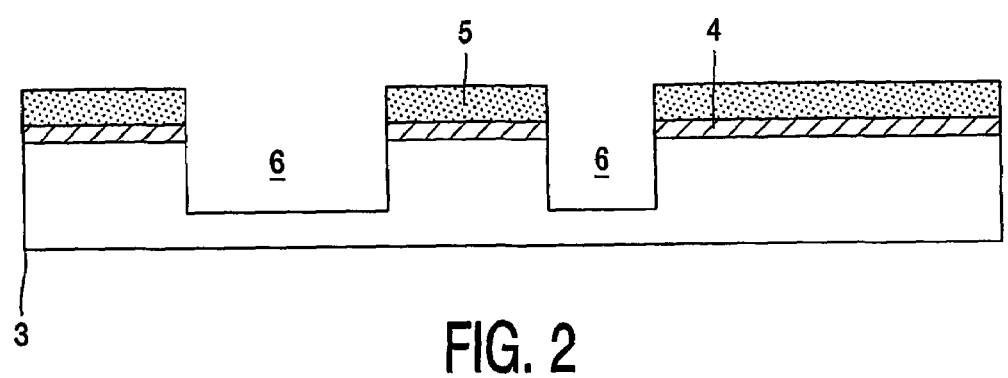

FIG. 1 shows a 700 μm thick silicon substrate 1, having a first side 2 and an opposite second side 3. The substrate 1 is provided on its first side 2 with a thermal oxide layer 4, e.g. 1 μm thick. If a passive substrate is to be obtained (cf. FIG. 8), the substrate 1 preferably comprises a high resistivity (preferably greater than 500 ohm.cm and more preferably more than 2000 ohm.cm) substrate. Silicon is the preferred semiconductor material, but other materials are not excluded. High-resistivity silicon may be high resistivity float zone silicon, high resistivity polycrystalline silicon, etc.

One preferred embodiment is that a monocrystalline silicon substrate is provided with a surface layer of a high-resistivity layer, such as amorphous silicon, on top of which an oxide layer is present.

However, if eventually an active substrate is to be obtained (see FIG. 23), the resistivity of the substrate 1 will depend on the active semiconductor to be obtained eventually, the resistivity of the substrate usually ranging from 20 ohm.cm for bipolar semiconductors to 20 mohm.cm for CMOS semiconductors. In the latter case, the substrate 1 may comprise fully processed IC wafers. Usually a thermal oxide layer (e.g. 1 μm thick) is provided on the first side of the substrate to prevent short-circuiting. The substrate material need not to be silicon, but could well be SiGe, SiC or also a III–V material. The substrate may further includes zones of which the resistivity is different. For active elements the semiconductor material such as Si or SiGe may be doped in zones required to provide junctions.

On the first side 2 of the substrate 1 shown in FIG. 1 a layer of a patternable material 5, such as a 10 μm thick resist mask, is applied. The patternable material 5 is then patterned leaving a pattern of the patternable material on the first side 2 of the substrate. Then, first cavity or cavities 6 are formed in the first side 2 of the substrate 1 by removing a part of the substrate 1 that is not provided with the layer of patternable material 5, e.g. by etching (see FIG. 2). The person skilled in the art will readily understand that the first cavity 6 may also be formed into a via (see second cavities 13 in FIGS. 10 and 16), if desired. Further the cavities 6 may have the same or different depths (which are usually obtained in different steps). Preferably, the first cavities 6 are formed using the Bosch process, as the first cavities 6 will then have very good sidewall slopes.

Figure 3:
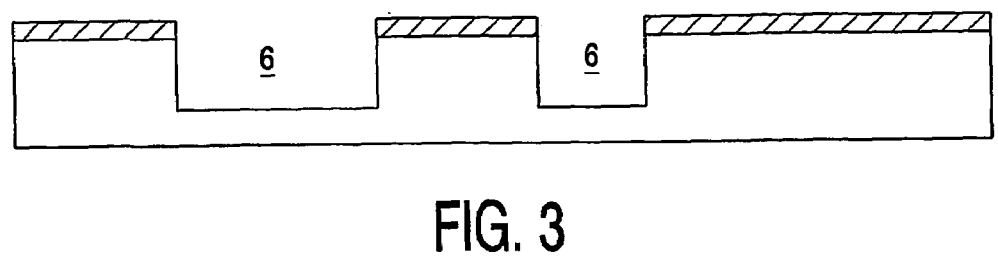

In FIG. 3 the patternable material 5 has been removed from the first side 2 of the substrate 1, e.g. in a thermal or chemical way.

Figure 4:
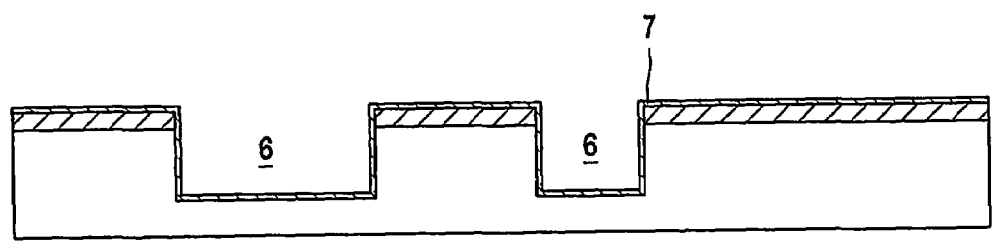
Figure 5:
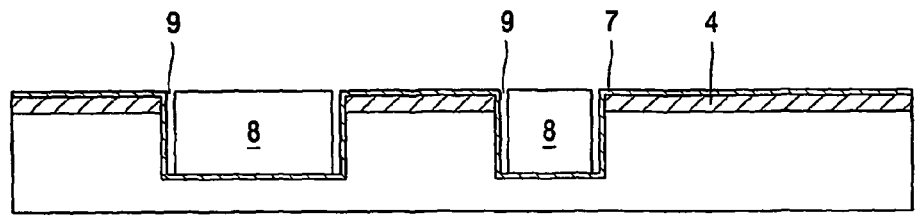

As shown in FIG. 4, the first side 2 of the substrate 3 is coated with a layer 7 of benzocyclobutene (BCB) to allow the active device 8 (shown in FIG. 5) to be adhered to the first side 2 of the substrate 1. The active device 8 may be an IC, die, etc. which may be placed in the first cavities 6 by using standard "pick and place" techniques. The first cavity 6 in the substrate 1 and the electronic element 8 together define a gap 9, the gap 9 surrounding the active device 8. The active device 8 is provided with connection pads (not shown). These connection pads are generally defined in a grid array pattern at the edge of the coupling surface of the active device. There is no need to do this in the present invention. Instead, the connection pads can be defined over the whole surface. This enables reduction of complexity of the active device.

Figure 6:
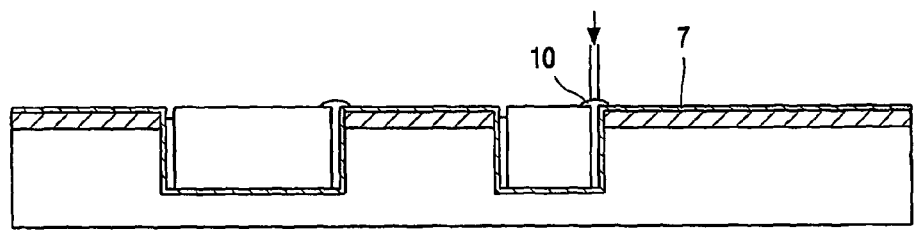

As shown in FIG. 6 the gaps 9 are filled with a material 10, preferably BCB. In the embodiment shown this is done by placing a small droplet of the material 10 just above the gap 9, which material 10 may then be spread over the gap 9 by capillary action. The filler material used to fill the cavity is preferably a material having a dielectric constant that is comparable to that of the semiconductor substrate. This has the advantage that the distributed capacitance between the signal line and ground is uniform along the length of the transmission line. In this respect the distance between the active device and the side walls of the substrate is preferably smallest possible. Generally, such filler materials are provided with a wet-chemical process, such as spincoating, spraying, web coating or the like. Suitable materials are for instance bencocyclobutenes and polyimides, as they provide very good adhesion properties. However, the filling material can be a metal as well, as far as the space between substrate and active device can be reached in a plating bath.

Then, the first side 2 of the substrate is planarized by applying a layer 11 of e.g. BCB or a polyamide on the first side 2 of the substrate 1. If BCB is used for both filling the gap between the electronic element 8 and cladding the walls of the first cavity 6, the electronic element 8 is then enclosed in BCB (see FIG. 7). Typically the layer 11 has a thickness of 5–10 μm. As is shown in the SEM microphotograph of FIG. 9, a remarkable planar first side 2 may be obtained with the method according the present invention.

Finally, connection pads 12 are defined and opened (see FIG. 8) by removing a part of the layer 11 at selected positions on the first side 2 of the substrate 1. The size of the connection pads may vary from that of vertical interconnect areas to bond pad sizes suitable for the use of metal or solder balls. Preferably the size is smaller than 50*50 μm, more preferably less than 20*20 μm. The opening of the connection pads by patterning of the layer 11 may be performed by etching.

Figure 8:
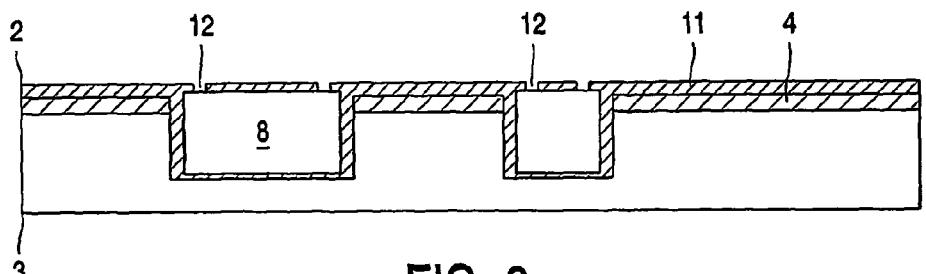

The passive semiconductor device or intermediate product obtained in FIG. 8 may be further processed or interconnected to other semiconductor devices.

Figure 7:
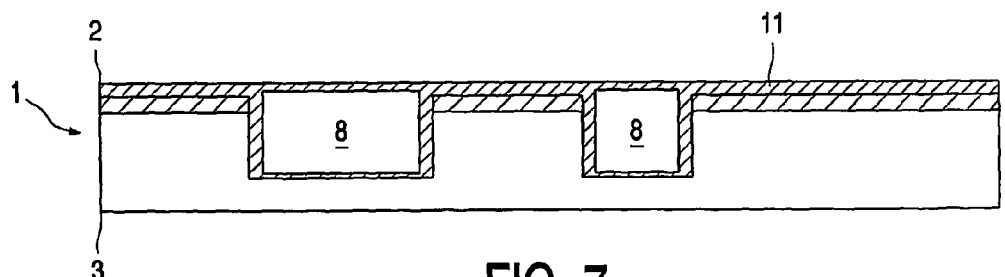
Figure 9:
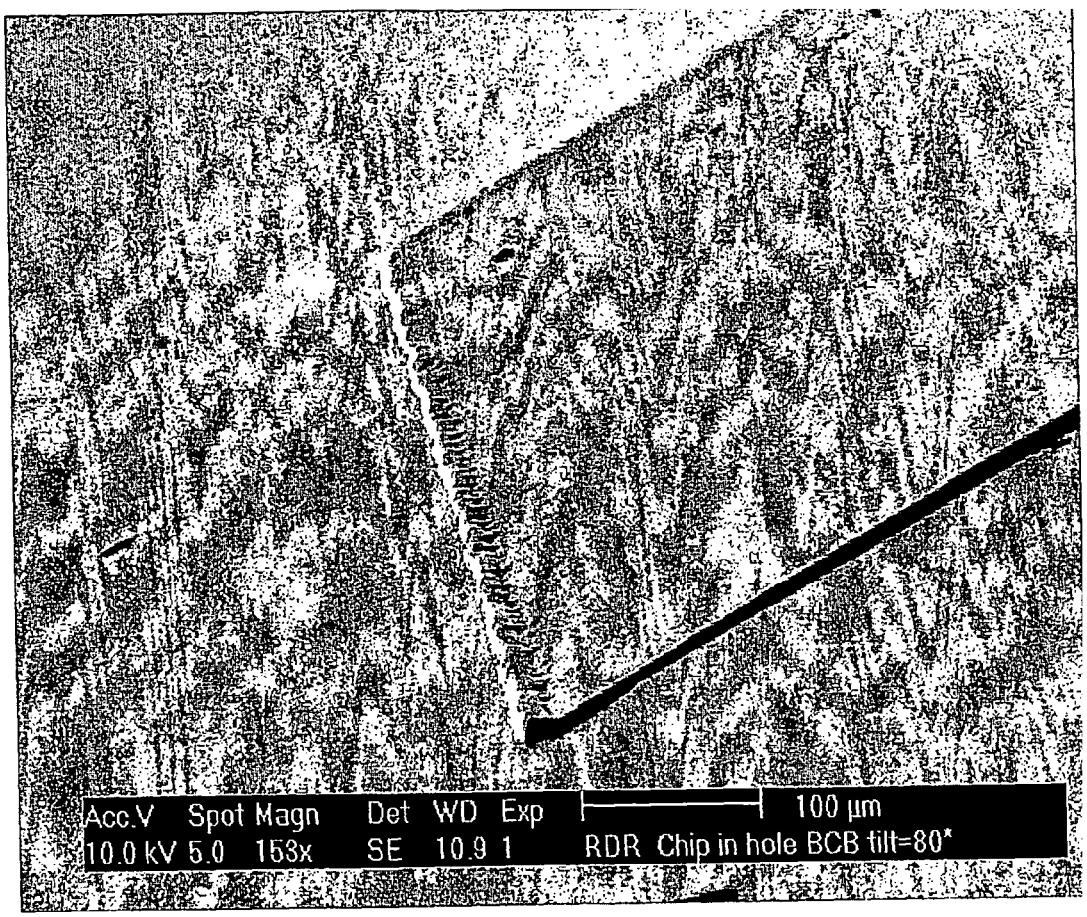
FIG. 9 shows a SEM microphotograph of a semiconductor device obtainable in FIG. 7.

FIG. 9 shows a SEM microphotograph of a cavitied IC after planarization of the first side 2 with the layer 11 (cf. FIG. 7). Note the remarkable planar surface of the first side 2.

FIGS. 10–23 show schematic cross-sectional views of different stages of the method according to the present invention.

The method of the present invention may be continued on the basis of the semiconductor device obtained in FIG. 8, or on the basis of a ready-made (intermediate) semiconductor device.

The semiconductor device obtained in FIG. 8 is further processed. If desired, second cavities 13 are formed in the substrate 1 in order to allow vias to be formed after thinning of the substrate 1 (see FIG. 16). However, these second cavities 13 may already have been formed at the same time as the first cavities 6 in FIG. 2.

Figure 10:
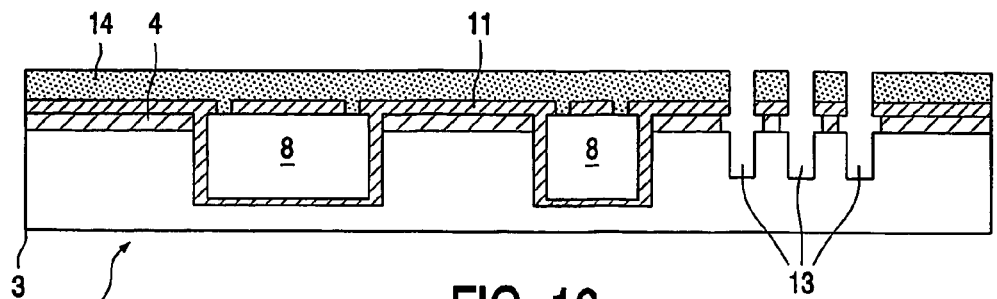
FIGS. 10–22 show diagrammatical cross-sectional views of further stages of the first method according to the present invention.
Figure 11:
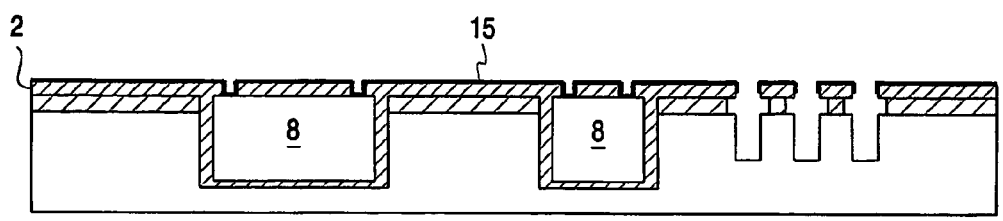

The second cavities may e.g. be formed by applying a layer 14 of a patternable material on the first side 2 of the substrate 1 obtained in FIG. 8; then patterning the layer 14 leaving a pattern of the patternable material on the first side 2 of the substrate 1; and forming second cavities 13 on the first side 2 of the substrate by removing a part of the substrate 1 not provided with the layer 14. The result is shown in FIG. 10.

Subsequently, the patterned layer 14 is removed from the first side 2 of the substrate 1. Then a seed layer 15 of an electronically conducting material (e.g. copper, Cr/Cu, Ti/Cu, etc.) is applied on the first side 2 of the substrate 1 (see FIG. 11), thereby at least covering the contacts 12 obtained in FIG. 8.

Figure 12:
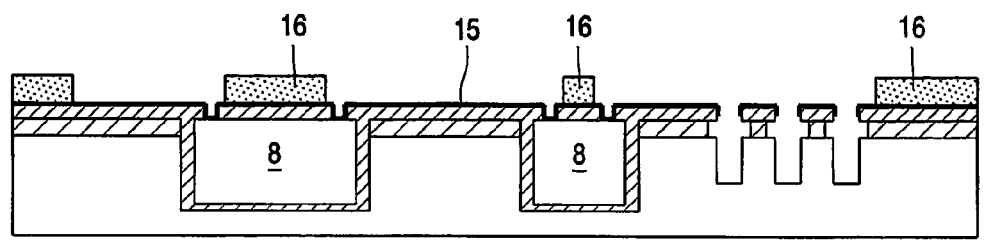
Figure 13:
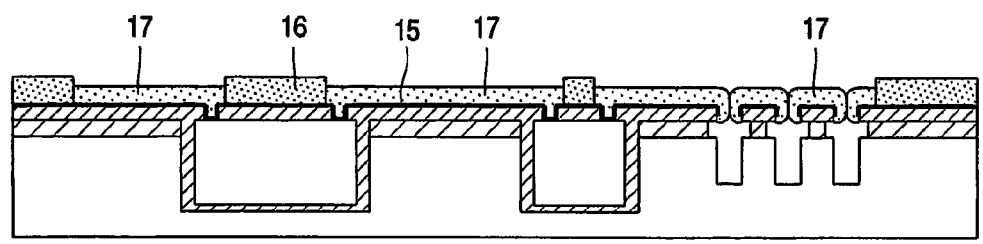
Figure 14:
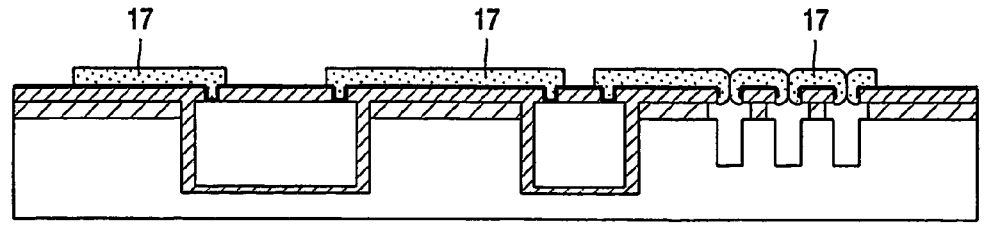

In order to provide the connections between the active device 8 and the interconnect structure, any suitable means can be used. This includes standard IC interconnect technology (i.e. growing metal layers of Al, AlCu or Cu for instance), and standard assembly interconnect technology, such as the use of metal or solder bumps or anisotropically conducting glue. In this example, as shown in FIG. 12 a plating mask 16 is then applied on the first side of the seed layer 15. Thereafter, a layer 17 of an electronically conducting material (e.g. copper) is applied on the top face of the seed layer 15, thereby at least partially filling up the plating mask 16 (see FIG. 13). Then, the plating mask 16 is removed from the first side 2 of the substrate 1 (FIG. 14).

The interconnect structure is in this example shown as a single layer, but this could we be a multilayer structure. The first element of the device could be defined in the substrate, such as is the case with diodes, and transistors, but can alternatively be defined in the interconnect stucture. Particularly, the electroplated layer provides a sufficient thickness so as to be used for inductors. Further examples of elements include micro-electromechanical system (MEMS) switches and capacitors, resonators, couplers, antennas, baluns, band pass filters, matching circuits and the like.

As a further step the substrate 1 is thinned thereby exposing the bottom face of the electronic elements 8 and opening the second cavities 13 to the second side 3 of the substrate 1 (see FIG. 16.), so as to provide the through-holes.

Figure 15:
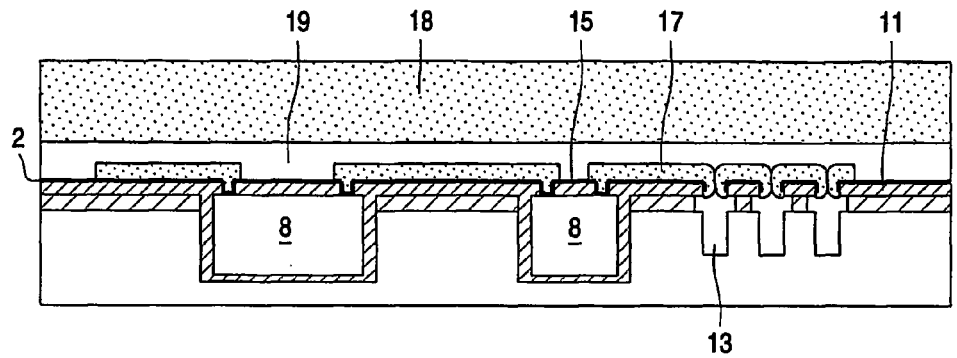

However, previously, as shown in FIG. 15, the first side 2 of the substrate may have been provided with a releasable support 18 to improve mechanical stability of the substrate 1. The support 18 may be connected to the substrate 1 using a layer of an adhesive 19. The person skilled in the art will readily understand that the support 18, which may e.g. comprise metal, glass, plastics, etc., may also be provided using any other suitable means. For example the support 18 may be an UV releasable foil. The bottom face of the support 18 being connected to the first side 2 of the substrate 1 is preferably as planar as possible.

Figure 16:
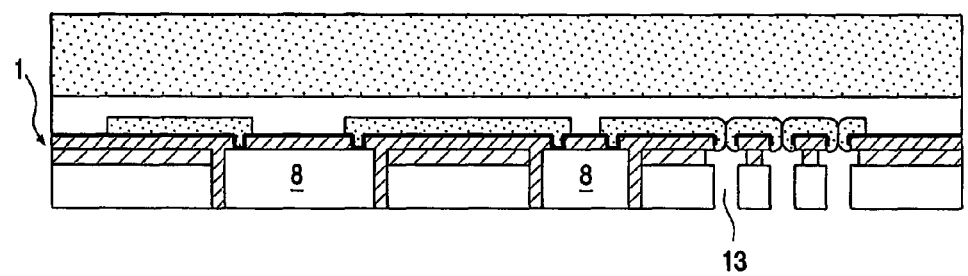

In FIG. 16 the result of the thinning of the substrate 1 is shown. Thinning reduces the length of the path from the active device to the heat sink. Thinning can be achieved with conventional techniques such as grinding and/or etching. The substrate is for instance thinned to a thickness of less than 100 micrometers, preferably to less than 50 micrometers, more preferably to less than 20 micrometers, most preferably to less than 10 micrometers.

Figure 17:
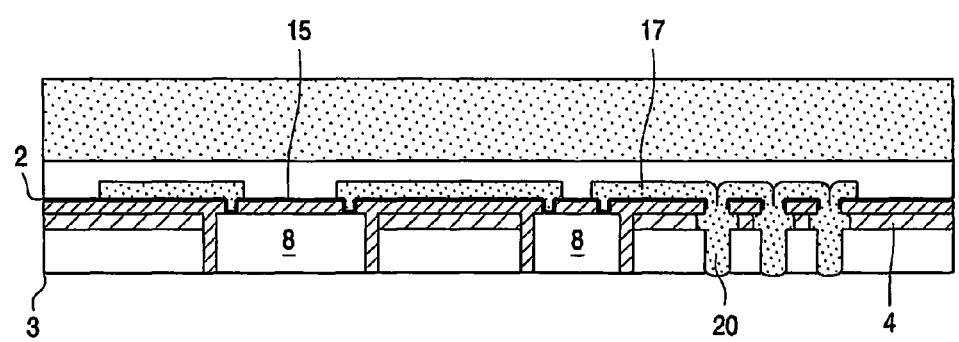
Figure 18:
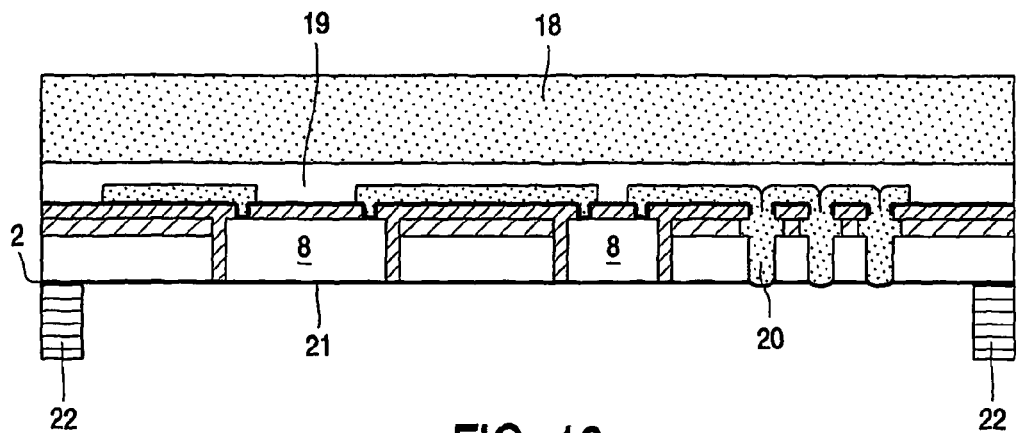

As shown in FIG. 17 the second cavities 13 opened in FIG. 16 are filled with an electrically conducting material 20 (e.g. copper). The material 20 may be filled in the second cavities 13 by electroplating, while the layer 17 is used as a plating base. The resulting vias are used to connect a further ground plane in the interconnect structure to the heat sink annex main ground plane. The further ground planes in the interconnect structure are needed so as to reduce the resistance of the interconnects by designing it as microstrip, stripline, coplanar waveguide or coupled transmission line. Coplanar waveguides are preferable in view of the achievable pattern density. Particularly preferable is a combination of a coplanar waveguide and a microstrip. This is a structure having one or two signal lines between two ground lines in one plane, and a ground in a neighbouring plane. In this manner, the interconnect (e.g. signal line) is optimally shielded from external influences. Alternatively or additionally, such vertical interconnects may be used to define bond pads at the second side of the device.

Then seed layer 21 of an electronically conducting material (e.g. copper) is applied on the second side 3 of the substrate 1 obtained in FIG. 17. Subsequently, a saw lane pattern 22 (e.g. from SU8 resist) is applied on the seed layer 21 (see FIG. 18).

Figure 19:
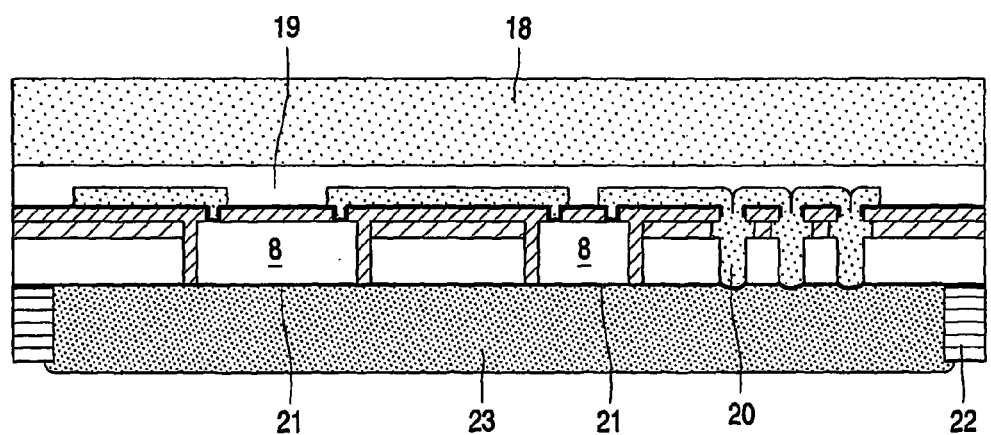

As shown in FIG. 19 then a layer of an electronically conducting material 23 (e.g. copper) is applied on the second side of the seed layer 21, preferably by electroplating, thereby at least partially filling up the saw lane pattern 22. The layer of electrically conducting material acts as a heat sink and as a ground plane. Additionally, it has the function of mechanical support. As a result of this transfer of the mechanical support function from the semiconductor substrate to the heatsink, a reduction of the substrate thickness is enabled. This leads to better heat dissipation, and a shorter path to the ground plane. In view of the ground plane and a reduced thickness of the substrate, the lateral interconnect in the interconnect structure extending over a substantial length in the order of micrometers, is provided with a transmission line character.

Figure 20:
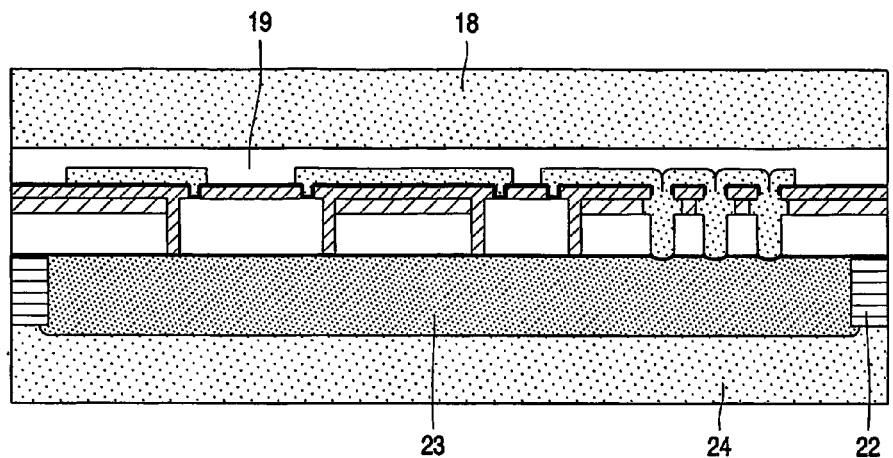
Figure 21:
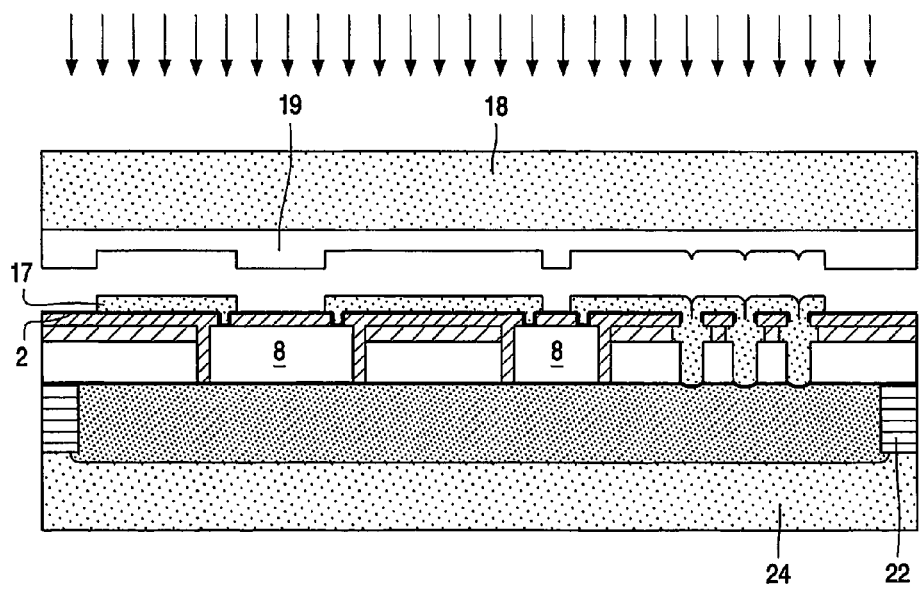

In FIG. 20 the substrate 1 is mounted on a standard separation foil 24. Thereafter, as shown in FIG. 21, the releasable support 18 and adhesive 19 are removed.

Figure 22:
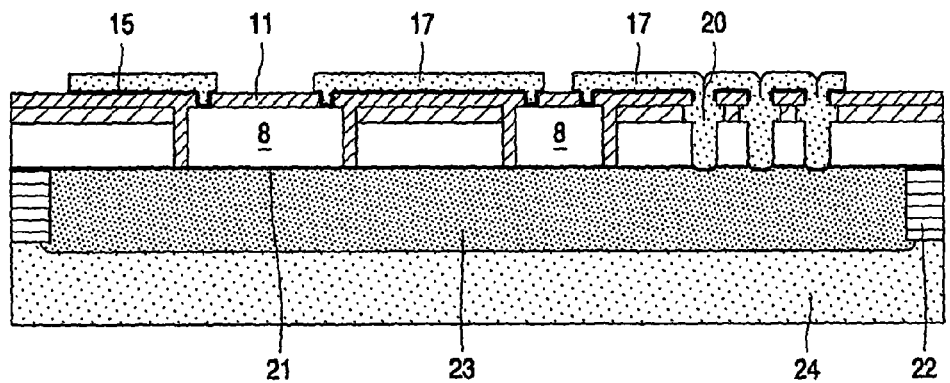

Then, the part of the seed layer 15 that is exposed after removing the plating mask 16 from the first side 2 of the substrate 1 in FIG. 14 is removed (see FIG. 22).

Figure 23:
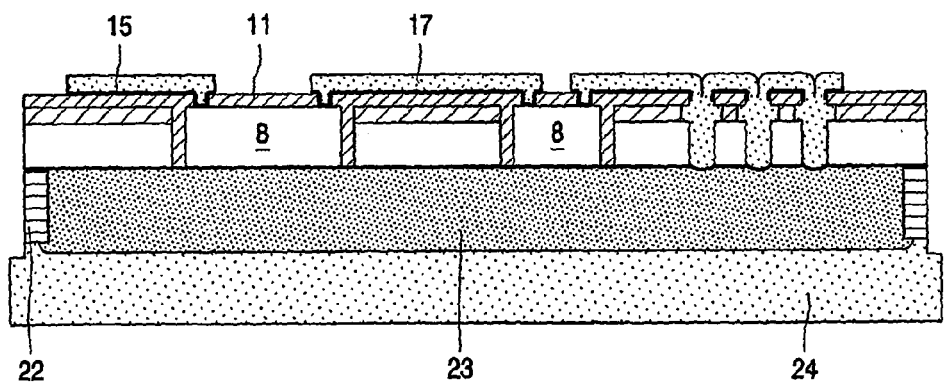
FIG. 23 shows a diagrammatical cross-sectional view of the resulting device.

Finally, the semiconductor devices are separated by separating at the saw lane 22, e.g. by sawing. An active semiconductor device as shown in FIG. 23 is then obtained.

Next, the individual devices may be further processed, e.g. soldered into or onto a package and subsequently connected (e.g. using wire bonding, flip chip and other conventional packaging techniques, etc.). Several options are possible:

In a first suitable embodiment no leadframe is necessary. Parts of the layer acting as heatsink, but electrically insulated therefrom, function as bondpads. Such bondpads are suitably connected to the interconnect structure by vertical interconnects. In such a manner the actual layout of bondpads and heatsink can be equal to that of standard leadframes such as the HVQFN-type.

In a second embodiment, the bond pads are defined in the interconnect structure at the first side of the substrate, and the device is assembled to a conductive plane in a leadframe with the heat sink at its second side. The bond pads, in operation carrying low-frequency signals only, are connected to the leadframe with wirebonding.

In a further embodiment, means for active heat removal are present on the second side of the substrate in addition to the heat sink. An example of such means are heat pipes. Such heat pipes can be located on top of the heat sink, but also adjacent to it, since a heat sink that is grown with electroplating or the like, can be limited in area with the help of photoresists.

The semiconductors according to the present invention are extremely suitable for use at frequencies above 10 and even 20 GHz.

FIG. 24–FIG. 31 shows schematically different stages of the second method resulting in the device of the invention. This second method differs from the first method, in that the active devices 8 are not provided in cavities 6 extending from the first side 2, but in cavities from the second side 3.

Figure 24:
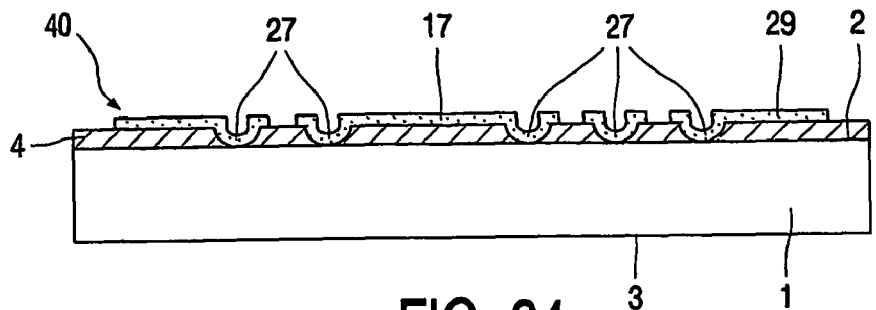
FIGS. 24–30 show diagrammatical cross-sectional views of different stages of the second method according to the invention.

FIG. 24 is a diagrammatical cross-sectional view of a first stage in this method. Basically, it shows a fully processed wafer of a semiconductor material, in this case silicon, on top of which an interconnect structure 40 is provided. The interconnect structure 40 comprises transmission lines 17 and vertical interconnects 27 extending to the first side of the semiconductor substrate 1 and through the thermal oxide layer 4. Contrary to conventional processing, there are vertical interconnects 27 that are not connected to underlying semiconductor elements. The interconnect structure further comprises bond pads 29 for external connection. These bond pads could be used for wirebonding. However, for a good high frequency behavior the use of solder balls is preferred. It is even more preferred that all high-frequency functions will be integrated on and in the substrate 1. In that case the connections are needed only for power and relatively low-frequency input and output signals. A flex foil can then be used therefore. For reasons of clarity a one-layer interconnect structure 40 is shown. However, in practice a multilayer interconnect structure is preferred.

Figure 25:
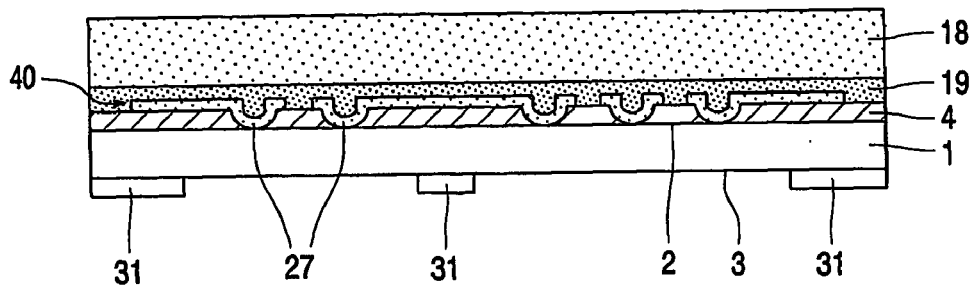

FIG. 25 shows the substrate 1 in a second stage of the processing. First of all, the substrate 1 as shown in FIG. 24 is provided with a mechanical support 18 on its first side 1. In this case, a glass support wafer 18 is used which is attached to the substrate 1 using UV releasable glue 19. Thereafter, the substrate 1 is thinned from its second side. These steps are identical with the steps shown in FIGS. 15 and 16. Finally, a suitable etching mask 31 is deposited and patterned. In this case an etching mask of aluminum is used, that has been provided by chemical vapor deposition and that has been patterned photolithographically. Such an etching mask 31 may also be provided in different manners, for instance with any kind of printing, with sputtering through a mask and the like.

Figure 26:
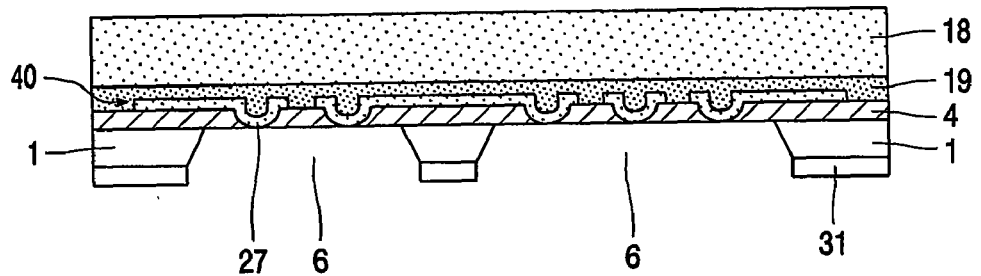

FIG. 26 shows the substrate 1 in a third stage, after the substrate has been etched through the etching mask 31 The etching mask 31 is suitable for dry etching, but also for wet etching with for instance potassium hydroxide or tetramethylammonium hydroxide. The result of this wet etching is cavities 6 with side walls that enclose an angle of 45 to 50° with respect to the plane of the substrate 1. These tapered side walls have the advantage that placement of active devices gets easier as the fit in the cavity is less tight.

This second method of the invention has the advantage that the substrate 1 at the second or at the third stage as shown in FIG. 25 and FIG. 26 can be transferred to an assembly plant for further processing. This further processing is done at a larger scale and involves standard steps such as die placement, electroplating and separation.

Figure 27:
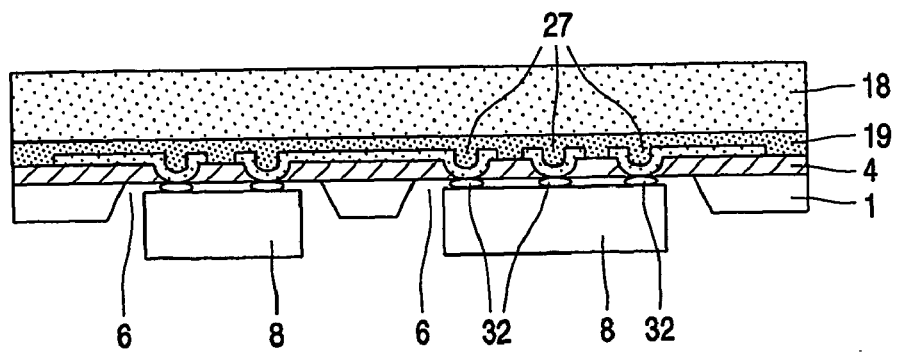

FIG. 27 shows the substrate 1 in a fourth stage, after placement of active devices 8. In order to ensure good contact, it is preferable for the vertical interconnects 27 which have appeared on the surface in the cavity 6 to be provided with metal contacts, particularly of Au, through electroless deposition of Ni/Au. The active devices 8 are provided with solder or metal bumps 32. After the placement, an underfill is provided and a heat treatment is performed so as to provide a metallic contact between the bumps 32 and the vertical interconnects 27. Instead of an underfill, use can be made of a liquifying layer which is provided in the cavity 6 before placement of the active devices 8. A good example of such liquifying layer is an acrylate layer, that will liquify under heating to about 60–100° C. Another example is benzocyclobutene (BCB), which becomes a waterlike fluid at about 170° C. When the temperature is brought to over 200° C., the BCB cures into a hard adhesive layer. A further alternative to the underfill is the provision of a glue layer on the surfaces of the active devices. The glue layer is preferably patterned, so as to enable the provision of bumps 32. A preferred glue layer is BCB.

Figure 28:
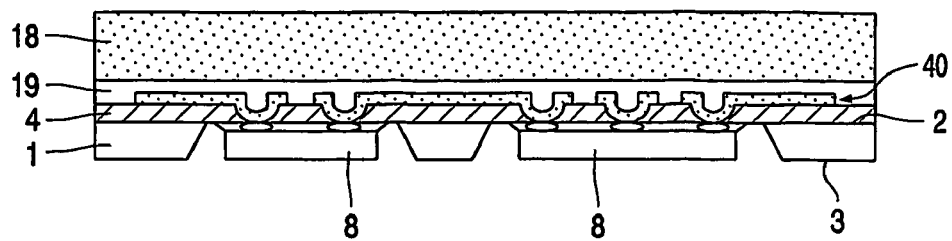

FIG. 28 shows the substrate 1 in a fifth stage, after provision of the underfill and after planarization of the rear sides of the active devices 8 and the second side 3 of the substrate 1.

The device 100 is now ready, but for the cavities 6 to be filled and the heatsink 23 to be applied. In this embodiment, the heatsink 23 fills the cavities 6, and it covers substantially the complete second side 3 of the substrate 1. It is however not necessary to fill the cavities with the heatsink. The cavities may be filled with a material having a thermal expansion coefficient that matches the thermal expansion of the active devices 8. Alternatively, an elastic material may be chosen, so that mechanical stress between the active devices 8 and the substrate 1 is absorbed.

Figure 29:
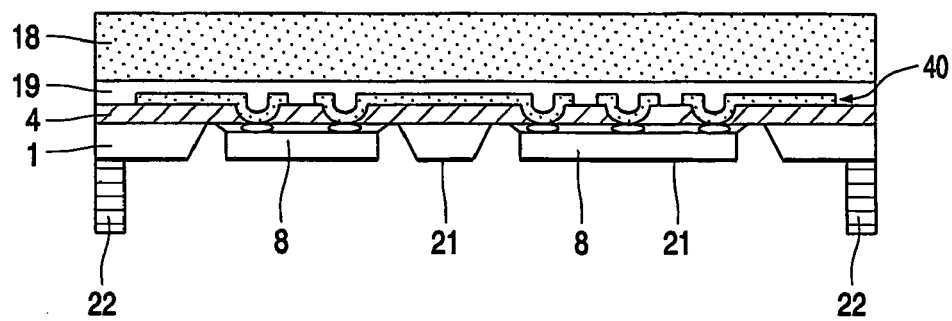

FIG. 29 shows the substrate 1 after a plating base 21 has been applied to the second side 3 of the substrate 1, and after a resist 22 has been provided and patterned in areas at which no heatsink is desired. A suitable plating base is Cr/Cu. A suitable resist is SU8.

Figure 30:
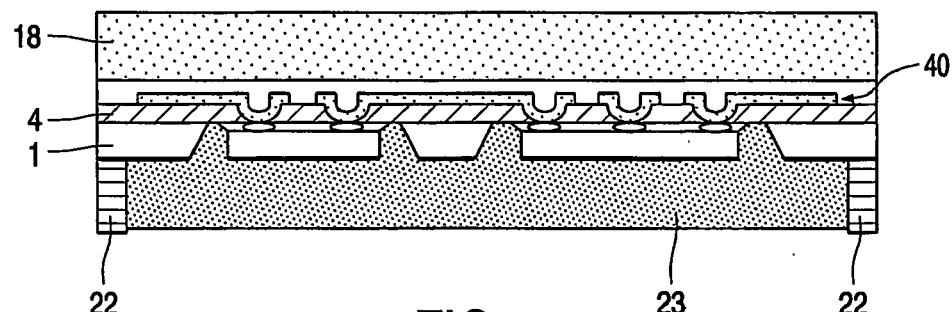

FIG. 30 shows the substrate 1 after that the heatsink 23 of copper has been grown by electroplating. The advantage of the electroplated copper is that it has a low stress. An advantage of the filling of the cavities 6 with the copper is that the active devices 8 get surrounded by metal. This metal acts as a Faraday cage, therewith suppressing electromagnetic coupling to the surroundings. The heat sink 23 may have a thickness of more than 100 μm. Mechanical stability is optimized thereby. This is not necessary, however, particularly not if the device is attached to a leadframe and encapsulated in a protecting mold.

Figure 31:
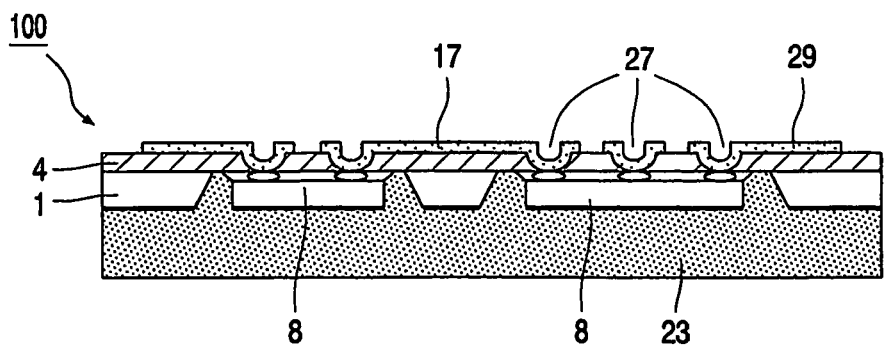
FIG. 31 shows a diagrammatical cross-sectional view of the resulting device.

FIG. 31 shows the device 100 after removal of the support wafer 18 and the separation. It will be understood that vertical interconnects may be provided between the interconnect structure and the heat sink, such as shown in FIG. 19. Although the Figure provides the suggestion that the substrate 1 is removed to a large extent, this need not be and is generally not the case.

Figure 32:
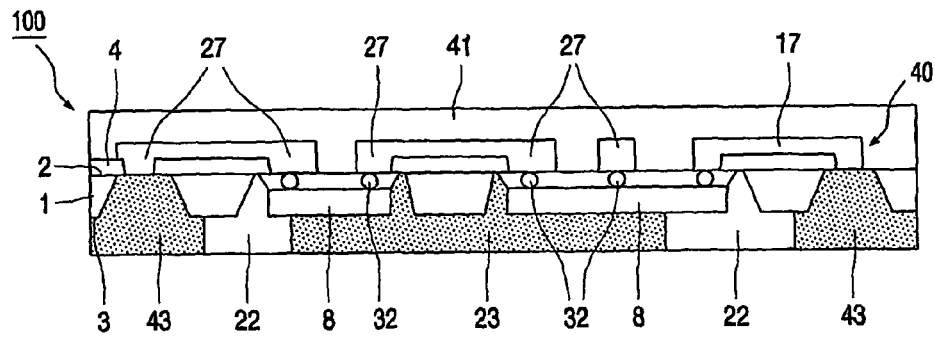
FIGS. 32 and 33 show diagrammatical cross-sectional views of further embodiments of the device.

FIG. 32 shows a diagrammatical cross-sectional view of another embodiment of the device 100 of the invention. In this embodiment, the heat sink does not completely extend over the second side 3 of the substrate 1. Instead thereof, contacts 43 are provided in addition to the heatsink 23, therewith enabling the placement of the device 100 on a carrier without the need for a leadframe. Nevertheless, the pattern of the contacts 43 and the heatsink 23 is at least largely identical with that of conventional leadframes, as for instance the HVQFN (high voltage quad flat non-leaded) leadframe. In order to realize this, the heatsink 23 may cover the active devices 8 only partially, as is shown in the Figure. In a further embodiment (not shown), the heatsink could be applied in two steps, the first layer of the heatsink having a different pattern than the second heatsink. This can be called "rerouting" of the heatsink.

In this embodiment, the first side 2 of the substrate 1 is provided with an encapsulating layer 41. This material is for instance a filled epoxy or a polyimide, as is known to the skilled person. This encapsulating layer 41 can be provided on wafer level, e.g. before separation of the device. It may have any desired thickness, for instance in the order of 0.1–100 μm, and is chosen such that it can be cut easily with conventional sawing apparatus. The encapsulating layer may be provided before the attachment of the support wafer, or after the removal of the support wafer. In principle, it could be used instead of the support wafer. Then however, the encapsulating layer is preferred to have sufficient thickness. Preferably, it is then provided as a multilayer stack. This stack could for instance include a security coating that is not transparent and cannot or can hardly be removed so as to prevent reverse engineering of the underlying circuit.

Figure 33:
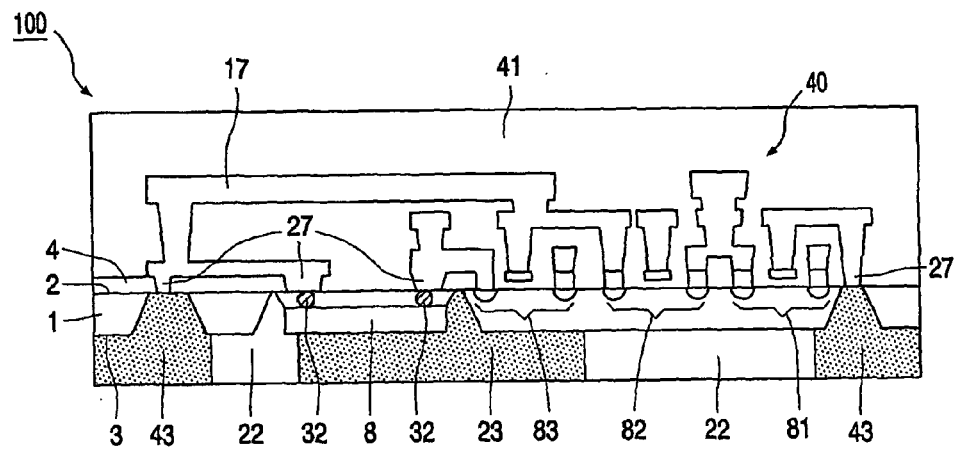

FIG. 33 shows a further embodiment of the device 100 of the invention. In this embodiment, the substrate 1 comprises active elements, in this case field effect transistors 81, 82, 83 having source electrode, drain electrode and gate electrode. The interconnect structure 40 in this embodiment includes not only the interconnects between the active devices 8 and other elements, but also the interconnects between the individual transistors 81,82,83, within the integrated circuit itself. In this case the interconnect structure 40 further includes vertical interconnects 27 extending to contacts 43 on the second side 3 of the substrate 1.

Although not shown here, it is preferred that the connection between the contacts 43 and the interconnect structure is made at the third or higher level of the interconnect structure only. In order to realize this, the interconnect structure is partitioned into an area for the integrated circuit and an area for the active device 8. These areas are mutually insulated by insulating material at the non-interconnected lower levels, so that the signal to the active device 8 does not affect the signal of the individual transistors 81,82,83.

Figure 34:
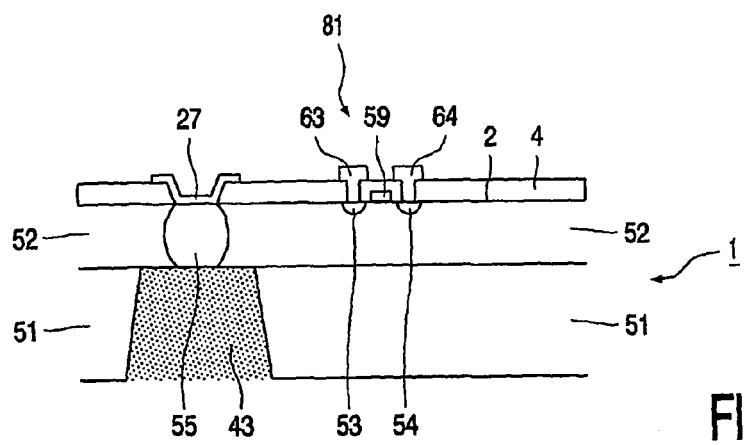
FIG. 34 shows a detailed cross-sectional view of a part of FIG. 33.

FIG. 34 shows a detail of FIG. 33 showing more clearly the connection to the contact 43 which is at the same level as the transistor 81. The connection to the active device 8 is basically the same as that to the contact 43. The semiconductor wafer is shown here to have various doping zones 51,52,53,54,55. The main part 51 of the substrate 1 that is partially removed is a $p^+$-zone. The transistor 81 is formed in and on a p-type epilayer 52. The source and drain electrodes 53, 54 are highly doped zones at the surface of this epilayer 52. Finally, there is a highly doped $n^{++}$-zone 55 acting as an interconnect. The transistor is further provided with a gate electrode 59, which is separated from the epilayer 52 through a non-shown thin gate oxide. The substrate 1 is provided with a thermal oxide 4 on its first side 2. This thermal oxide 4 is patterned and vertical interconnect 27, as well as contacts 63, 64 to the source, drain and gate electrode are provided (the contact to the gate is not shown).

It is understood that a metal connection that is suitably insulated from the semiconductor substrate may be used instead of the highly doped zone in the silicon itself. The undesired interaction between vertical interconnects and transistors can be prevented through the use of adequate design rules, such as for instance a minimal distance of 5 to 10 μm. The resulting effect is negligible in view of the fact that the epilayer 52 generally has a very limited thickness only.

Figure 35:
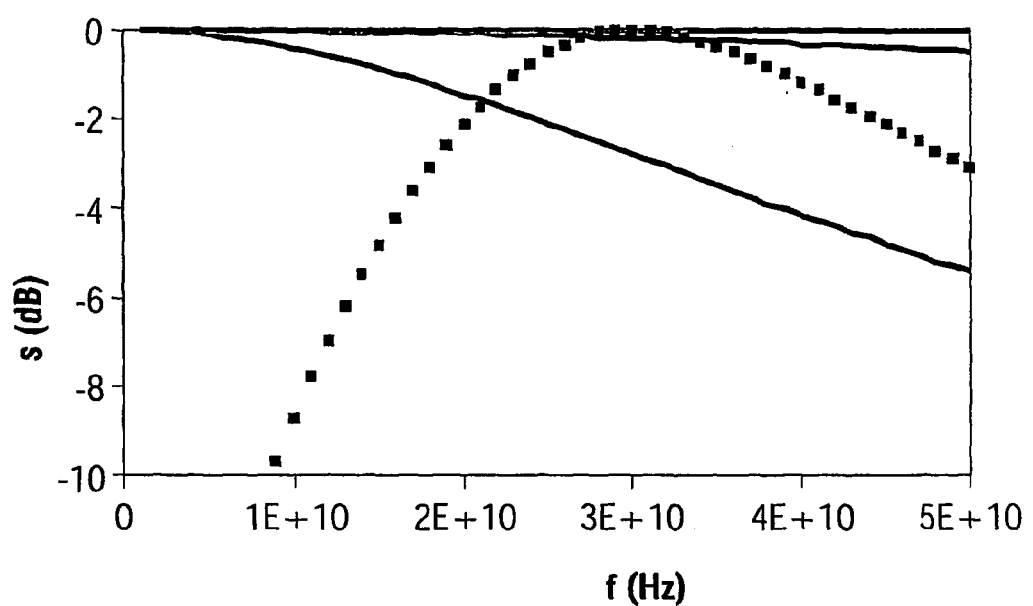
FIG. 35 shows a graph showing the transmissions of coupling made with bond wires, metal balls and thin film interconnects.

FIG. 35 shows a graph in which the transmission as a function of the frequency is compared for various coupling techniques. The continuous lines show from the bottom to the top the transmission of a bond wire, of a metal or solder ball and of an thin-film interconnect. The dotted line shows a bond wire compensated with a capacity at 30 GHz. The graph is the result of a simulation done for the transfer of a source of 50 Ω to another source of 50 Ω. The result of the use of bond wires without compensation is a transmission of −3 dB at 30 GHz. This corresponds to a reduction of the signal intensity by 50%. The compensated bond wires provides a better result at those frequencies, but have the disadvantage that only for exactly 30 GHz the transmission is unaffected. At about 25 GHz the transmission is only −1 dB. This is already problematic, in view of the large number of signals to be processed and particularly in view of the fact, that the signals are preferably kept small at these frequencies so as to reduce heat dissipation.

Figure 36:
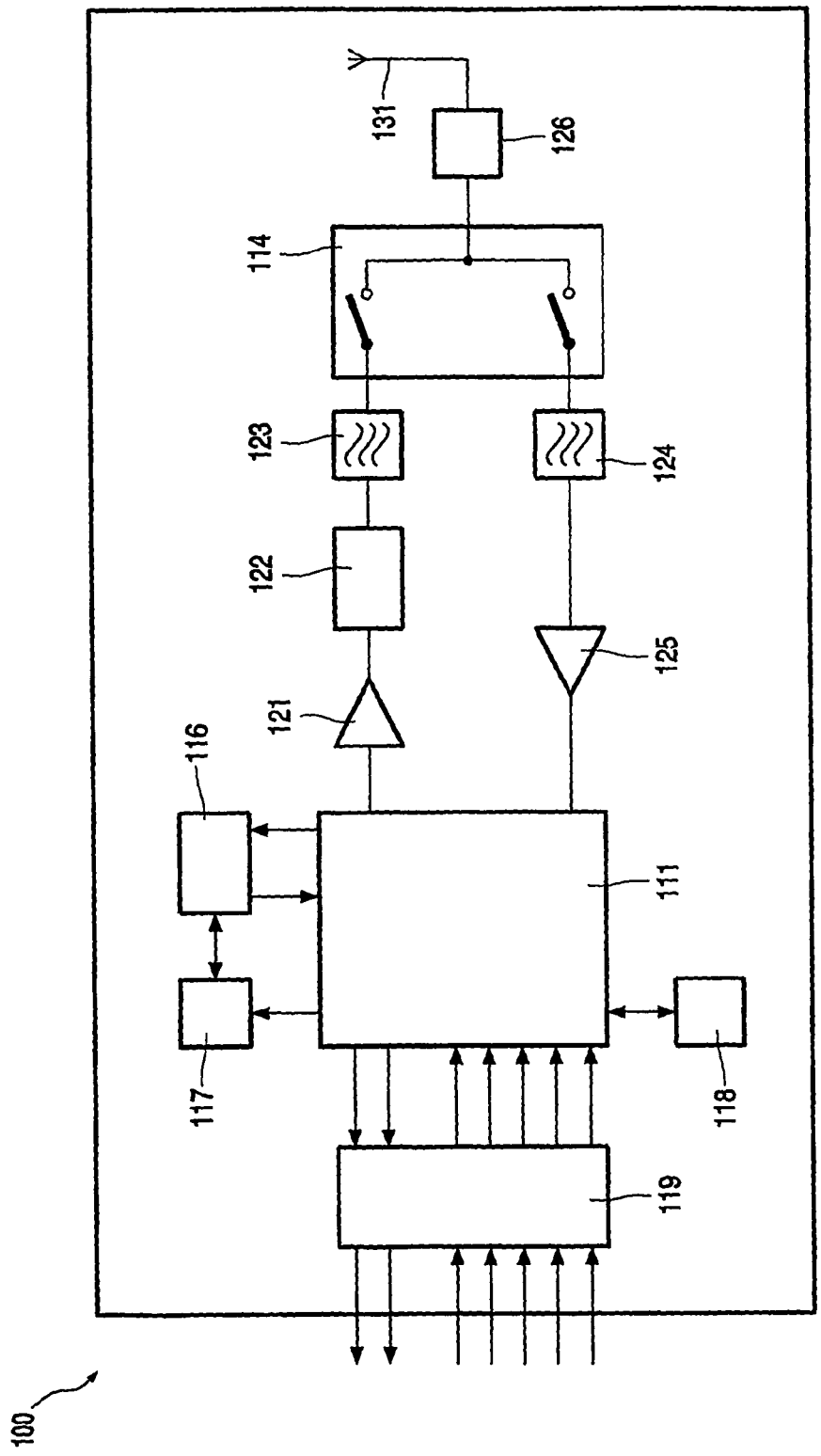
FIG. 36 shows a block diagram of an electronic device according to the invention.

FIG. 36 shows a block diagram of an electronic device according to the invention, which contains only low-frequency input signals. The device 100 comprises a transceiver 111, which is provided with six inputs. These input signals and the corresponding output signals are converted through a multiplexer and demultiplexer unit 119. Coupled to the transceiver are a VCO tank 116, a PLL loop filter 117 and a supply decoupling unit 118. The transceiver 111 is capable of sending signals to the antenna 131 and receiving signals from the antenna 131. A TX/RX switch 114 is present for switching from the receiver to the transmitter function and vice versa. The transmit path between the transceiver 111 and the switch 114 comprises a power amplifier 121 and an impedance matching function 122, as well as a filter 123. The power amplifier 121 generally comprises two or more stages, one of which may be bypassed. The receive path between the switch 114 and the transceiver 111 comprises a filter 124, and a low-noise amplifier 125. This low noise amplifier can be integrated in the transceiver 111. A bandpass filter 126 is present between the antenna 131 and the switch 114.

Although not shown here for reasons of clarity, the TX/RX switch 114 generally comprises the switching function between different frequency bands, such as the DSC band, the GSM band, the Bluetooth band and any further band. The TX/RX switch comprises furthermore the passive elements and switches needed to prevent any amplified signal from reaching a receive path in which it will blow up the amplifier. However, particularly if high frequencies are present, it is advantageous to use separate antennas for different frequency ranges. Antennas for high frequencies of 20 GHz can be very small, and the band separation gets easier.

In the present invention, the TX/RX switch 114 and the impedance matching function is realized with MEMS-capacitors and switches, which are provided as part of the interconnect structure. The power amplifier 121 is realized as an active device with a substrate of a III–V material, such as GaAs of GaN. Good results have been obtained in that the active device comprises transistors of the HBT-type. The transceiver 111 is embodied as an active device with a substrate of a III–V material, particularly of InP, that is suitable for frequencies from 10–40 GHz. For the Voltage Controlled Oscillator 116 use is made of an active device of a SiGe substrate. These active devices are all provided in cavities, but alternatively the VCO 116 may be embodied in the substrate itself. The PLL loop filter 115 is spread over the interconnect structure and the substrate. Alternatively, the VCO 116 could be assembled to this separate unit. The bandpass filters and other filters can be baluns and LC filters, which are integrated in the interconnect structure. At least some of them can alternatively be BAW-filters. These can be suitably provided as separate blocks in cavities in the substrate or with bumps on the interconnect structure. Such passive functions can be provided on top of the substrate with bumps, since they do not need any connection to a heat sink.

The person skilled in the art will understand that many modifications may be made without departing from the scope of the appended claims.

The invention claimed is:

1. An electronic device comprising:
   a substrate of a semiconductor material having a first and a second opposite side, which is provided with a first through-hole extending from the first to the second side, the substrate being provided with a first electrical element on its first side;
   an active device having a coupling surface provided with connection pads, which device is present in the first through-hole of the substrate with its coupling surface on the first side of the substrate,
   a thin film interconnect structure being provided on the first side of the substrate extending over the first through-hole and interconnecting the active device with the electrical element, the interconnect structure comprising connection faces corresponding to the connection pads,
   a heat sink is present on the second side of the substrate extending over the first through-hole and at least part of the substrate, and
   bond pads for connection to an external system, characterized in that the active device is made to process signals of a first frequency, and the first electrical element is part of a transformer for transforming the signals of the first frequency to a second, lower frequency and/or vice versa, so that in operation the bond pads transmit signals at the second frequency and that the heat sink operates as a ground plane.

2. An electronic device as claimed in claim 1, characterized in that wireless coupling means are present for transmission of signals at the first frequency to and/or from an external system.

3. An electronic device as claimed in claim 2, wherein the transformer comprises multiplexers and demultiplexers and the signal of the second frequency is a low-frequency signal.

4. An electronic device as claimed in claim 2, wherein the wireless coupling means include a dipolar antenna and signals are transmitted from the dipolar antenna to one or more active devices as differential signals without a transformation into single-ended format.

5. An electronic device as claimed in claim 2, further comprising an impedance matching circuit that is embodied as a second active device at least partially, which second active device is present in a second through-hole in the substrate.

6. An electronic device as claimed in claim 5, wherein the second active device comprises a microelectromechanical system (MEMS) element.

7. An electronic device as claimed in claim 1, wherein the substrate of semiconductor material is a high-ohmic silicon substrate.

8. An electronic device as claimed in claim 1, wherein a vertical interconnect extends from the interconnect structure through the substrate to the ground plane.

9. A device as claimed in claim 1, comprising means for signal transmission and amplification in at least two frequency bands.

10. A device as claimed in claim 2, wherein the wireless coupling means comprise an opto-electronic semiconductor element enabling a transformation of an optical signal into an electric signal.

11. A device as claimed in claim 10, further comprising an antenna.

12. An audio and video transmission system comprising the device as claimed in claim 1.

13. Use of the electronic device as claimed in claim 1 for transmission and amplification of a signal at a frequency of at least 2 GHz.

* * * * *